United States Patent [19]

Yoshikawa

[11] Patent Number: 4,752,180

[45] Date of Patent: Jun. 21, 1988

[54] METHOD AND APPARATUS FOR HANDLING SEMICONDUCTOR WAFERS

[75] Inventor: Kiyoshi Yoshikawa, Kawasaki, Japan

[73] Assignee: Kabushiki Kaisha Toshiba, Kawasaki, Japan

[21] Appl. No.: 895,814

[22] Filed: Aug. 12, 1986

[30] Foreign Application Priority Data

Feb. 14, 1985 [JP] Japan ................................ 60-25173

[51] Int. Cl.$^4$ ............................................. B65G 47/91
[52] U.S. Cl. .................................... 414/737; 414/763; 414/786
[58] Field of Search ................. 228/5.1, 6.1, 115, 116, 228/124; 414/225, 737, 763, 786, 783

[56] References Cited

U.S. PATENT DOCUMENTS

| 3,887,783 | 6/1975 | Comette | 228/5.1 |
| 3,921,885 | 11/1975 | Knox | 228/116 |
| 4,181,249 | 1/1980 | Peterson et al. | 228/124 |
| 4,196,837 | 4/1980 | Burkart | 228/122 |
| 4,226,569 | 10/1980 | Gerard et al. | 414/737 |
| 4,409,278 | 10/1983 | Jochym | 228/124 |
| 4,529,353 | 7/1985 | Dean et al. | 414/225 |

FOREIGN PATENT DOCUMENTS 49-26455 7/1974 Japan .

OTHER PUBLICATIONS

Yoshikawa, K., "Nikkei Electronics", Jan. 27, 1986, pp. 108–110.

Primary Examiner—Nicholas P. Godici
Assistant Examiner—Richard K. Seidel
Attorney, Agent, or Firm—Finnegan, Henderson Farabow, Garrett and Dunner

[57] ABSTRACT

A method and apparatus for handling semiconductor wafers comprises first and second tables having first and second elastic bases each of which has one surface on which a semiconductor wafer having a mirror surface is mounted with the mirror surface facing up and the other surface, and a plurality of through holes extending from one to the other surfaces thereof, a suction mechanism for reducing pressure in the through holes and chucking the semiconductor wafers to said bases and a projecting mechanism, provided to face the other surface of at least said second base, for urging the other surface to elastically deform said base corresponding thereto, thereby projecting a central portion of said base to project the mirror surface of the semiconductor wafer. The projecting mechanism includes projecting member having a conical end surface which is capable of being brought into contact with the other surface of the second elastic base.

13 Claims, 4 Drawing Sheets

METHOD AND APPARATUS FOR HANDLING SEMICONDUCTOR WAFERS

BACKGROUND OF THE INVENTION

The present invention relates to a method for handling mirror surface finished semiconductor wafers and an apparatus therefor.

In a typical technique used in the manufacture of semiconductor devices, a semiconductor layer of a specific conductivity type is formed on a semiconductor substrate by a CVD method and a functional element is formed in this region. In this CVD method, it is necessary to prevent an impurity from diffusing or mixing in from the substrate into the semiconductor layer.

Recently, a demand for an element with a high dielectric withstand voltage is high. Dielectric withstand voltage can be improved by thickening the semiconductor layer. However, it takes extremely long time to do this by the CVD method, and it is more difficult to prevent a diffusing of impurity.

In the invention described in Japanese patent publication No. 49-26455, semiconductor wafers are bonded such that semiconductor layers oppose each other, so as to prevent impurity mixing and to reduce manufacturing time as compared with the case wherein a semiconductor layer is formed using the CVD method. The method is performed as follows. Mirror surface finished semiconductor wafers are placed to oppose each other in an atmosphere of a gas mixture consisting of oxygen and nitrogen, and phosphorus is diffused into each mirror surface at a temperature of 1,200° C. for 30 minutes using phosphorus oxychloride as an impurity. The wafers are then heated at a temperature of 1,150° C. for an hour. After placing the wafers in a vacuum, the wafers are bonded at a pressure of 150 kg/cm$^2$ and a temperature of 1,300° C.

However, when a bonding temperature is higher than that during diffusion as described above, the diffusion impurity is redistributed during bonding to change a surface concentration of an impurity layer. In addition, wafer alignment in a vacuum is difficult to perform and results in high cost.

In order to solve the above problem, a method of bonding wafers in air at room temperature is disclosed by the present inventor in "Nikkei Electronics", Jan. 27, 1986, p. 108 to 110. In this method, after the mirror surfaces of wafers are washed with water and excess water is removed, the wafers are bonded together in a clean atmosphere utilizing residual water on the mirror surfaces. According to this method, impurity redistribution is prevented and wafer alignment is easy.

However, in this method, air bubbles are left between wafers to form voids in their interfaces.

SUMMARY OF THE INVENTION

It is an object of the present invention to provide a method of handling wafers without forming voids even when wafers are bonded in air at room temperature, and a mechanism therefor.

DETAILED DESCRIPTION OF THE PREFERRED EMBODIMENT

An embodiment of the present invention will now be described with reference to the accompanying drawings.

Figure 1:
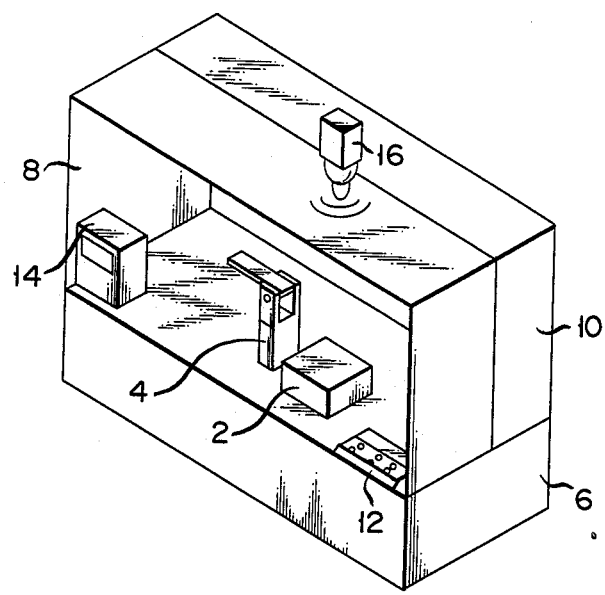
FIG. 1 is a perspective view schematically showing a wafer bonding system which uses a bonding apparatus according to an embodiment of the present invention.

FIG. 1 shows a wafer bonding system which uses a wafer bonding apparatus of the present invention comprising first and second supports 2 and 4. Rectangular enclosure 8 with an open front and a transparent top and clean unit 10 positioned therebehind are provided on pedestal 6. A filter (not shown) which cleans air supplied horizontally from a blower of the clean unit to the enclosure is provided between unit 10 and enclosure 8. With this mechanism, the interior of enclosure 8 is kept clean. In enclosure 8 on pedestal 6, first and second supports 2 and 4 are installed adjacent and opposite each other and panel 12 and TV monitor 14 are spaced apart from supports 2 and 4. Monitor camera 16 is positioned at a distance of, e.g., 500 mm from and above the top surface of enclosure 8. Operations of supports 2 and 4 are monitored by camera 16 and displayed on TV monitor 14. Operations of supports 2 and 4 can be controlled by observing TV monitor 14 and operating panel 12.

Figure 2:
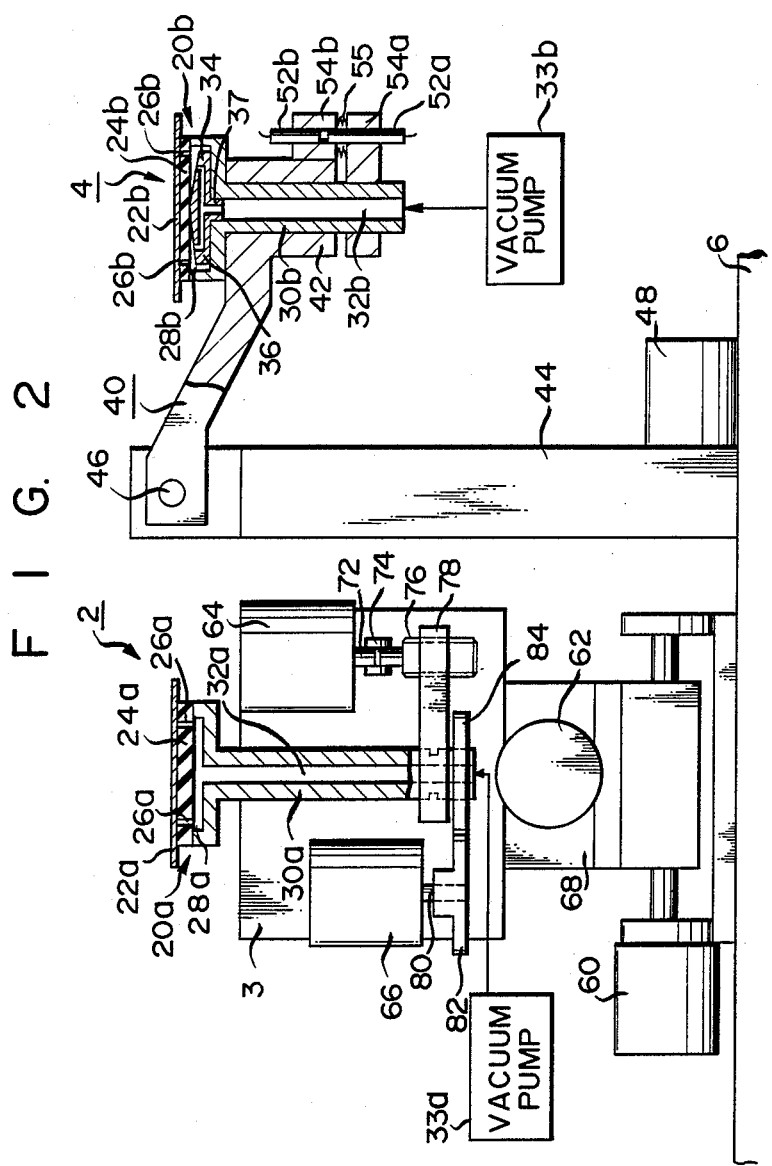
FIG. 2 is a partially broken side view showing a bonding apparatus according to the embodiment of the present invention with wafers mounted and chucked.

As shown in FIG. 2, first and second supports 2 and 4 have first and second chuck tables 20a and 20b, respectively. Tables 20a and 20b comprise disk-like first and second elastic bases 24a and 24b. Base 24a and 24b have flat surfaces on which semiconductor wafers 22a, 22b are mounted with their mirror surfaces facing up. Bases 24a and 24b may be made of an elastic material such as rubber, or a material which is not elastic itself but imparts elasticity upon being formed into a thin member. Bases 24a and 24b have a plurality of through holes 26a and 26b, respectively. These holes are preferably formed near the periphery of the base such that the center of the base is conveniently projected. Tables 20a and 20b have support members 30a and 30b which support bases 24a and 24b on their upper surfaces, respectively. Members 30a and 30b are cylindrical with their upper portions enlarged horizontally. Cavities 28a and 28b whose upper surfaces are closed by elastic bases 24a and 24b are formed in the upper portions of support members 30a and 30b. Paths 34a and 32b are respectively formed in support members 30a and 30b so that their upper ends communicate with cavities 28a and 28b and their lower ends are open at the lower surfaces of support members 30a and 30b.

Projecting member 34 which faces the other surface of base 24b and projects at the center thereof is vertically movably housed in cavity 28b of table 20b of support 4. More specifically, an upper surface of projecting member 34 is conical. Columnar sliding portion 37 projects from the lower surface of projecting portion 34 and is slidable with respect to the inner upper wall of path 32b of support member 30b. Path 36 is formed in projecting member 34 so that its lower end is open at the lower surface of sliding portion 37 and its upper end at the conical surface. Path 36 normally communicates cavity 28b with path 32b. Lower ends of paths 32a and 32b of support members 30a and 30b are respectively communicated with vacuum pumps 33a and 33b for evacuating paths 32a and 32b. Wafers 22a and 22b respectively mounted on bases 24a and 24b are drawn upon operation of vacuum pumps through paths 32a and 32b, cavities 28a and 28b, and holes 26a and 26b, and are chucked to surfaces of bases 24a and 24b.

Support member 30b is slidably fitted in a vertical through hole in bracket 42 mounted on one end of rotating arm 40. In the state shown in FIG. 2, support member 30b is held such that its lower surface is in contact with the upper surface of bracket 42. First fixing member 54a is mounted on a lower portion of support portion 30b projecting from the lower end of bracket 42, and fixes at its one end first terminal 52a constituting a contact sensor for wafers. Second terminal 52b cooperates with terminal 52a to constitute the sensor. Terminal 52b is coaxial and at a predetermined distance from terminal 52a, and is fixed by second fixing member 54b projecting horizontally on the lower portion of bracket 42 of arm 40. The contact sensor generates an electrical signal when its terminals are not in contact with each other. The contact sensor is electrically connected to a motor so as to close a drive circuit of a Z pulse motor which is described later, and to a drive circuit of a vacuum pump for evacuating a pedestal so as to stop the operation of the pump by an electrical signal. Coil spring 55 is arranged between fixing members 54a and 54b so as to bias first fixing member 54a downwardly.

Arm 40 is mounted through shaft 46 on arm support column 44 whose lower portion is fixed to pedestal 6 so as to pivot about the shaft in a vertical plane. Shaft 46 is rotated by motor 48 via a known transmission mechanism in column 44.

First support 2 comprises block 3 which supports table 20a to be rotatable and vertically movable, and X, Y, Z, and θ pulse motors 60, 62, 64, and 66. Motors 60 and 62 can move X-Y stage 68 horizontally, i.e., in X and Y directions by desired amounts. Block 3 is mounted on X-Y stage 68 to move therewith. Z and θ moving mechanism is installed in block 3. Bolt 76 is connected through joint member 74 to rotating shaft 72 of motor 64 which is fixed to block 3. Bolt 76 is screwed into a female threaded through hole formed in lift plate 78. The lift plate is connected to support member 30a to be free from rotation of support member 30a and interlocked with vertical movement thereof. In order to provide this connection, a connecting mechanism comprising a recess which is formed at an outer periphery of support member 30b and engageable with a projection provided on plate 78 can be adopted.

First gear 82 is coaxially mounted on rotating shaft 80 of motor 66 which is fixed to block 3. Gear 82 is meshed with second gear 84 which is coaxially mounted on the lower portion of support member 30a. Gears 82 and 84 are arranged such that gear 82 is meshed with gear 84 and is free from vertical movement thereof.

A method of bonding semiconductor wafers using a bonding apparatus having the above construction will now be described with reference to FIGS. 3 and 4A to 4C.

Figure 3:
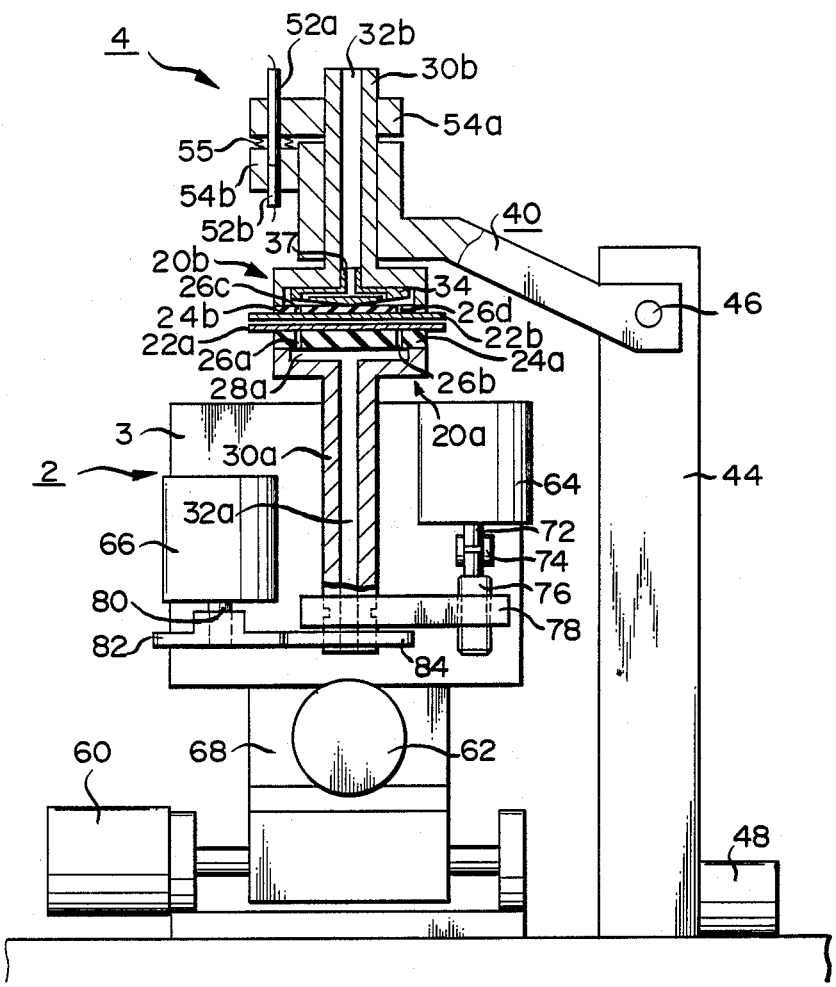
FIG. 3 is a partially broken side view showing the apparatus with wafers opposing each other and the center of a mirror surface of an upper wafer projecting.
Figure 4A:
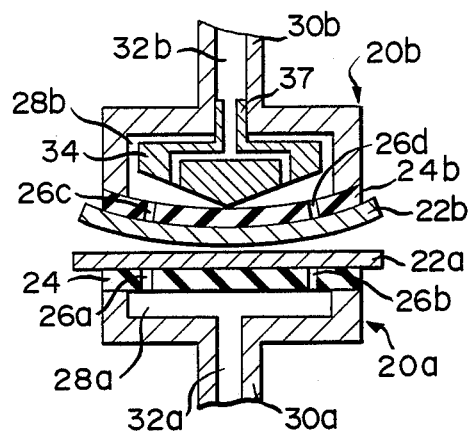
FIGS. 4A to 4C are sectional views showing a part of the apparatus in each step which illustrates a method of bonding wafers.
Figure 4B:
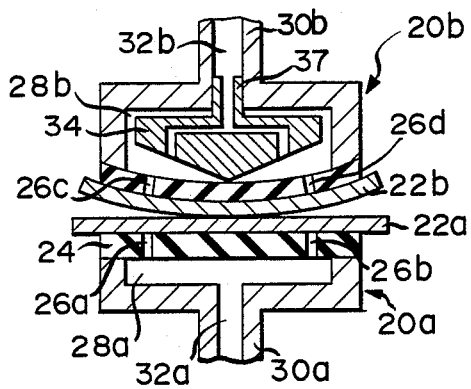
Figure 4C:
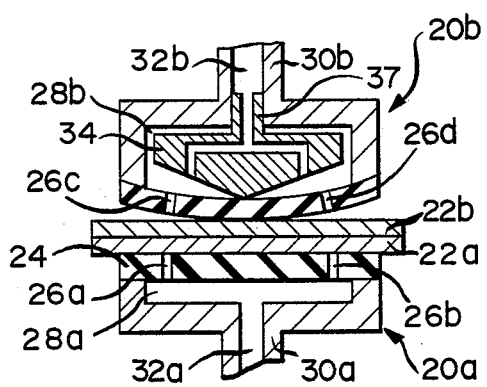

Wafers 22a and 22b having mirror surface finished upper surfaces are respectively chucked on first and second elastic bases 22a and 22b by evacuating table 20a and 20b. Next, as shown in FIG. 3, motor 48 is driven to pivot arm 40 counterclockwise through 180°. As a result, second support member 30b moves downwardly against the biasing force of spring 55 by its own weight and is held where first terminal 52a is in contact with second terminal 52b. In addition, projecting member 34 moves downwardly by its own weight and urges base 24b such that the center portion thereof projects downwardly. It will be obvious that vertical alignment of support member 30b and a projection action of the wafer can be achieved automatically by pivoting arm 40 through 180°. In this state, support member 30a is horizontally shifted and pivoted by driving and controlling X, Y, and θ motors 60, 62, and 66 to match orientation flats of both wafers. Next, Z motor 64 is driven to move support member 30a upwardly to bring wafer 22a into contact with the central portion of wafer 22b, as shown in FIG. 4B. By this contact, the second wafer or the second support member is slightly shifted upwardly, terminals 52a and 52b are disconnected, and an electric signal is generated to stop motor 64 and the vacuum pumps. As a result, wafer 22b whose central portion projects downwardly is released from suction by base 24b. The periphery of wafer 22b moves downwardly to regain its flatness as a whole, and the entire surface thereof is brought into contact with wafer 22a. In this case, a bonding region of wafers 22a and 22b extends from the central portion to the periphery to prevent air bubbles from being trapped in the interface. The present invention is not limited to the above embodiment, and various changes and modifications may be made without departing from the spirit and scope of the present invention. For instance, a projecting member may be arranged so as to project lower wafers, or the central portions of two wafers may be projected. In this case, a means for moving the projecting members is required. In the above embodiment, a semiconductor wafer is projected and then moved to be brought into contact with another semiconductor wafer at their central portions. However, semiconductor wafers may be brought into contact with each other by projecting the central portion(s) of the wafer(s).

Figure 5:
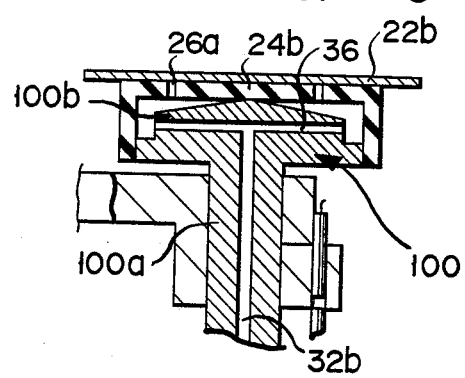
FIG. 5 is a sectional view showing a part of a modified mechanism.

In the above embodiment, the projecting member and the support member are provided independently of each other. However, they may be formed as an integral structure, as will be described with reference to FIG. 5.

Cylindrical support member 100 is formed such that it has lower portion 100a, which extends through bracket 42 and is slidable in the axial direction thereof, and upper portion 100b, which is projected from the upper surface of bracket 42 and has a diameter larger than that of lower portion 100a. The upper surface of upper portion 100b is formed to be conical, thus forming a projecting member. Straight path 36 is provided in upper portion 100b such that it is open at the circumference of upper portion 100b. This path communicates with path 32b provided in lower portion 100a. Cylindrical support base 24b, made of an elastic material such as rubber, is attached to the upper portion of support member 100 such that the interior of support base 24b defines a space sealed by upper portion 100b. Support base 24b is provided with through holes 26a at a position shifted from the center thereof.

With the support member having the above construction, if the air in the support base 24b through paths 32b and 36 is sucked, the upper wall of support base 24b is pulled to support member 100 and deformed into a conical shape that conforms with the shape of the upper portion of support member 100. At this time, wafer 22b is deformed together with elastic member 24b in such a manner that the peripheral portions of wafer 22b are pulled toward the projecting member more greatly than the central portion. Accordingly, the central portion of wafer 22b is projected, as in the embodiment described above.

What is claimed is:

1. A method of handling semiconductor wafers comprising the steps of:
   projecting a central portion of a mirror surface of at least one wafer of two semiconductor wafers having mirror surfaces;
   opposing said two wafers to each other and bringing the central portions of the mirror surfaces of the two wafers into contact with each other; and
   enlarging a contact region from the central portions to peripheries of the mirror surfaces of the wafers.

2. A method according to claim 1, wherein said projecting step comprises the step of flattening the mirror surface of one wafer and projecting the central portion of the mirror surface of the other wafer toward said one wafer.

3. A method according to claim 2, wherein said projecting step comprises the step of conically projecting the mirror surface of the other wafer.

4. A method according to claim 3, wherein said method comprises the step of opposing said wafers each other and aligning them before said projecting step.

5. An apparatus for handling semiconductor wafers comprising:
   first and second tables, having respective first and second elastic bases, said first and second elastic bases each having first and second surfaces, each of said first surfaces being adapted to receive a semiconductor wafer having a mirror surface facing up and the other surface of the semiconductor wafer in contact with the first surface of the elastic base, and a plurality of through holes extending from the first to the second surfaces of said elastic base;
   a suction mechanism for reducing pressure in said through holes to chuck the semiconductor wafers to said bases;
   a projecting mechanism, provided to face the other surface of at least said second base, for urging against said elastic base to elastically deform said base, thereby projecting a central portion of said elastic base to deform the mirror surface of the semiconductor wafer into a substantially convex shape;
   first and second support mechanisms for supporting said first and second tables and said projecting mechanism; and
   drive means for moving said first and second support mechanisms relative to each other and pressing the mirror surfaces of the semiconductor wafers into contact with each other.

6. An apparatus according to claim 5, wherein said first and second elastic bases are supported at one ends of the first and second support members, the support members having shafts and paths which communicate with said through holes of said bases, and said suction mechanism evacuates said paths of said first and second support members to reduce pressure in said through holes.

7. An apparatus according to claim 6, wherein said first support mechanism has a block which supports said first table pivotally about its axis and movably along the axis.

8. An apparatus according to claim 7, wherein said drive means comprises a rotating mechanism for rotating said first table with respect to the block and a moving mechanism for axially moving said first table with respect to said block.

9. An apparatus according to claim 8, wherein said apparatus comprises an X-Y table having said block thereon.

10. An apparatus according to claim 6, wherein said second support mechanism comprises an arm for axially and movably supporting said second table and a support column for pivotally supporting said arm, and said drive means comprises an arm pivoting mechanism for pivoting said arm to allow the semiconductor wafer on said second elastic base to face the semiconductor wafer on said first elastic base.

11. An apparatus according to claim 10, wherein said projecting mechanism comprises a projecting member provided axially and movably in the path of said second table and having at a center of one end surface thereof a projection capable of being brought into contact with the other surface of said second elastic base.

12. An apparatus according to claim 11, wherein one end surface of said projecting member is conical.

13. An apparatus according to claim 5, which comprises a sensor which senses the contact between the central portions of said semiconductor wafers and thereupon releases evacuation in said through holes of the second elastic base.

* * * * *

UNITED STATES PATENT AND TRADEMARK OFFICE
CERTIFICATE OF CORRECTION

PATENT NO. : 4,752,180
DATED : June 21, 1988
INVENTOR(S) : Kiyoshi YOSHIKAWA

It is certified that error appears in the above-identified patent and that said Letters Patent is hereby corrected as shown below:

Title Page, [30] delete "Foreign Application Priority Data" and "Feb. 14, 1985 [JP] Japan 60-25173" this application was filed as a Non Convention.

Signed and Sealed this

Twenty-seventh Day of June, 1989

Attest:

DONALD J. QUIGG

*Attesting Officer*   *Commissioner of Patents and Trademarks*